United States Patent
Mamdouh (10) Patent No.: US 9,347,689 B1
(45) Date of Patent: May 24, 2016

(54) APPARATUS AND METHOD FOR RENEWABLE ENERGY SYSTEM

(71) Applicant: Georgy Mamdouh, Brooklyn, NY (US)

(72) Inventor: Georgy Mamdouh, Brooklyn, NY (US)

(*) Notice: Subject to any disclaimer, the term of this patent is extended or adjusted under 35 U.S.C. 154(b) by 635 days.

(21) Appl. No.: 13/735,674

(22) Filed: Jan. 7, 2013

Related U.S. Application Data (60) Provisional application No. 61/631,510, filed on Jan. 5, 2012.

(51) Int. Cl.
| | |
|---|---|
| H02J 1/00 | (2006.01) |
| H02J 3/00 | (2006.01) |
| H02N 6/00 | (2006.01) |
| F24J 2/38 | (2014.01) |
| F03D 9/00 | (2016.01) |

(52) U.S. Cl.
CPC .. *F24J 2/38* (2013.01); *F03D 9/002* (2013.01)

(58) Field of Classification Search
None
See application file for complete search history.

(56) References Cited

U.S. PATENT DOCUMENTS

| | | | |
|---|---|---|---|
| 7,045,702 B2* | 5/2006 | Kashyap | 136/244 |
| 2008/0072958 A1* | 3/2008 | Dutta | 136/256 |
| 2008/0078670 A1* | 4/2008 | Al-Garni et al. | 202/234 |
| 2011/0145811 A1* | 6/2011 | Middendorf et al. | 717/178 |
| 2011/0218687 A1* | 9/2011 | Hadar et al. | 700/292 |
| 2014/0351010 A1* | 11/2014 | Kong | 705/7.29 |

\* cited by examiner

*Primary Examiner* — Jared Fureman
*Assistant Examiner* — Aqeel Bukhari
(74) *Attorney, Agent, or Firm* — Chambliss, Bahner & Stophel, P.C.

(57) ABSTRACT

A renewable energy system comprising a solar panel that is adapted to be mounted on a structure and convert solar energy into electrical energy, a windmill that is adapted to be mounted on the structure and convert wind energy into electrical energy, and a means for shutting down the renewable energy system that is adapted to automatically shut down the system in the event of an emergency. A method for a renewable energy system comprising providing a renewable energy system and converting renewable energy into electrical energy.

18 Claims, 8 Drawing Sheets

APPARATUS AND METHOD FOR RENEWABLE ENERGY SYSTEM

CROSS-REFERENCES TO RELATED APPLICATIONS/PATENTS

This application relates back to and claims priority from U.S. Provisional Application for Patent No. 61/631,510 titled "Apparatus and Method for Renewable Energy System" and filed on Jan. 5, 2012 and U.S. Provisional Application for Patent No. 61/795,354 titled "Apparatus and Method for Renewable Energy System" and filed on Oct. 15, 2012.

FIELD OF THE INVENTION

The present invention relates generally to energy systems, and particularly to renewable energy systems.

BACKGROUND AND DESCRIPTION OF THE PRIOR ART

It is known to use renewable energy systems to provide energy to users. Conventional renewable energy systems, however, suffer from one or more disadvantages. For example, conventional renewable energy systems do not optimally utilize all of the different available sources of renewable energy to provide energy to users. Conventional renewable energy systems are also complex and expensive to manufacture, maintain and repair. In addition, conventional renewable energy systems do not include satisfactory safety systems. Further, conventional renewable energy systems are not sufficiently customizable.

It would be desirable, therefore, if an apparatus and method for a renewable energy system could be provided that would optimally utilize all of the different available sources of renewable energy to provide energy to users. It would also be desirable if such an apparatus and method for a renewable energy system could be provided that would be less complex and less expensive to manufacture, maintain and repair. It would be further desirable if such an apparatus and method for a renewable energy system could be provided that would include satisfactory safety systems. It would be still further desirable if such an apparatus and method for a renewable energy system could be provided that would be sufficiently customizable.

Advantages of the Preferred Embodiments of the Invention

Accordingly, it is an advantage of the preferred embodiments of the invention claimed herein to provide an apparatus and method for a renewable energy system that optimally utilizes all of the different available sources of renewable energy to provide energy to users. It is also an advantage of the preferred embodiments of the invention claimed herein to provide an apparatus and method for a renewable energy system that is less complex and less expensive to manufacture, maintain and repair. It is another advantage of the preferred embodiments of the invention claimed herein to provide an apparatus and method for a renewable energy system that includes satisfactory safety systems. It is still another advantage of the preferred embodiments of the invention claimed herein to provide an apparatus and method for a renewable energy system that is sufficiently customizable.

Additional advantages of the preferred embodiments of the invention will become apparent from an examination of the drawings and the ensuing description.

SUMMARY OF THE INVENTION

The apparatus of the invention comprises a renewable energy system. The preferred renewable energy system comprises a solar panel that is adapted to be mounted on a structure and convert solar energy into electrical energy, a windmill that is adapted to be mounted on the structure and convert wind energy into electrical energy, and a means for shutting down the renewable energy system that is adapted to automatically shut down the system in the event of an emergency.

The method of the invention comprises a method for a renewable energy system. The preferred method comprises providing a renewable energy system as described herein and converting renewable energy into electrical energy.

BRIEF DESCRIPTION OF THE DRAWINGS

The presently preferred embodiments of the invention are illustrated in the accompanying drawings, in which like reference numerals represent like parts throughout, and in which.

DESCRIPTION OF THE PREFERRED EMBODIMENTS OF THE INVENTION

Referring now to the drawings, the preferred embodiments of the apparatus and method for a renewable energy system in accordance with the present invention are illustrated by FIGS. 1 through 8. As shown in FIGS. 1-8, the preferred embodiments of the apparatus and method for a renewable energy system are adapted to optimally utilize all of the different available sources of renewable energy to provide energy to users. The preferred embodiments of the invention are adapted to provide an apparatus and method for a renewable energy system that is less complex and less expensive to manufacture, maintain and repair. The preferred embodiments of the invention claimed herein are adapted to provide an apparatus and method for a renewable energy system that includes satisfactory safety systems. The preferred embodiments of the apparatus and method for a renewable energy system are adapted to provide an apparatus and method for a renewable energy system that is sufficiently customizable.

Figure 1:
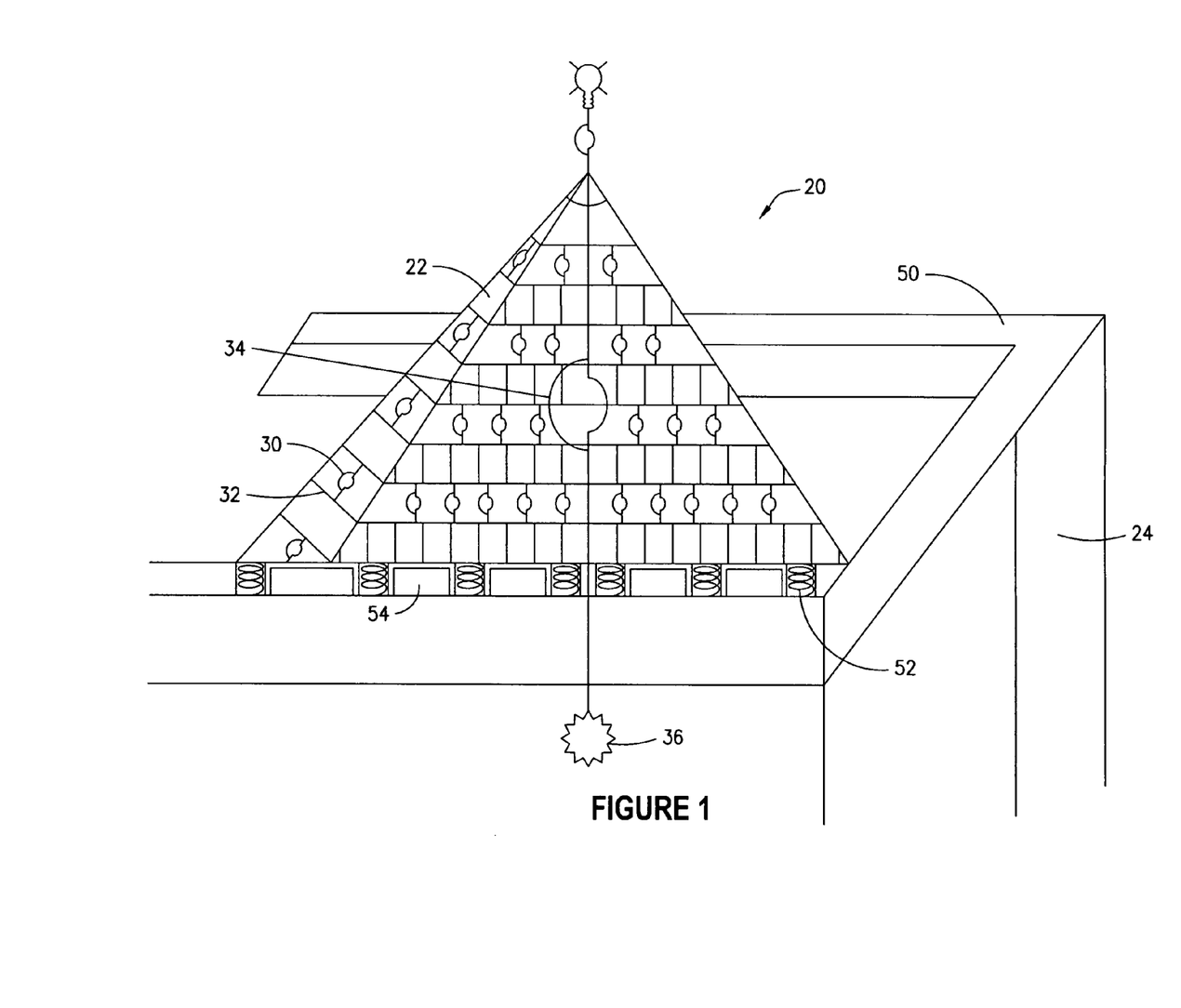
FIG. 1 is a perspective view of the preferred embodiment of the renewable energy system in accordance with the present invention.

Referring now to FIG. 1, a perspective view of the preferred embodiment of the renewable energy system in accordance with the present invention is illustrated. As shown in FIG. 1, the preferred renewable energy system is designated generally by reference numeral 20. Preferred renewable energy system 20 comprises a plurality of solar panels 22 which are adapted to be mounted on a structure such as building 24 and convert solar energy into electrical energy. Preferably, solar panels 22 are configured in a pyramid-shaped arrangement. It is contemplated within the scope of the invention, however, that the plurality of solar panels may be configured and arranged in any suitable arrangement, including without limitation a plane, a dome, a sphere, a cube, a cone, a cylinder, a triangular prism, a cuboid, a bipyramid, a trapezohedra, a polyhedron, a honeycomb, a Johnson solid and the like. It is also contemplated within the scope of the invention that a single solar panel may be provided.

Still referring to FIG. 1, preferred renewable energy system 20 also comprises a plurality of windmills 30 which are adapted to be mounted on a structure like building 24 and/or at base 32 of plurality of solar panels 22. Preferred windmills 30 are also adapted to convert wind energy into electrical energy. In addition, preferred renewable energy system 20 comprises primary windmill 34 which is connected to windmill clutch 36. While FIG. 1 illustrates the preferred configuration and arrangement of the plurality of windmills, it is contemplated within the scope of the invention that the plurality of windmills may be of any suitable configuration and arrangement. It is also contemplated within the scope of the invention that a single windmill may be provided.

Still referring to FIG. 1, preferred renewable energy system 20 still further comprises bird protection system 50 and a plurality of shock absorbers such as springs 52 and rubber padding 54. The preferred bird protection system 50 is adapted to deter birds and other animals from entering the area around renewable energy system 20. Preferably, bird protection system 50 utilizes ultrasound to deter animals. It is contemplated within the scope of the invention, however, that the bird protection system may utilize any suitable means for deterring animals from entering the area around the renewable energy system. The preferred shock absorbers are adapted to minimize vibrations produced by the moving components of the renewable energy system. In preferred renewable energy system 20, electrical energy produced by the system could be conveyed to and stored in a local or remote battery system (see e.g. FIG. 6) or conveyed to the grid. Also in preferred energy system 20, windows of the building on which the system is used may be covered with a transparent photovoltaic sheet to maximize the generation of electrical energy from solar energy. While FIG. 1 illustrates the preferred configuration and arrangement of the shock absorbers, it is contemplated within the scope of the invention that the shock absorbers may be of any suitable configuration and arrangement.

Figure 2:
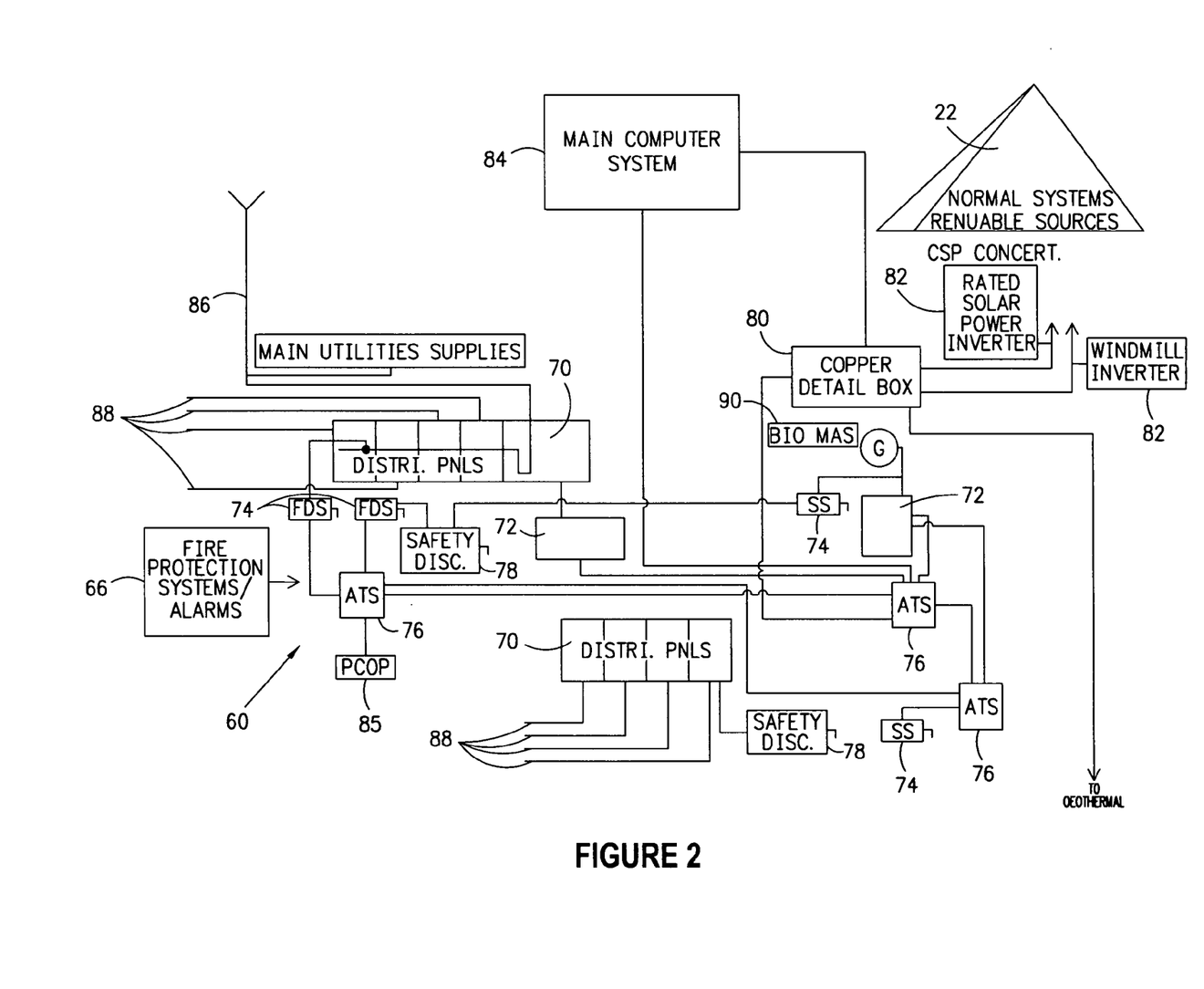
FIG. 2 is a schematic view of the preferred renewable energy systems illustrated in FIG. 1.

Referring now to FIG. 2, a schematic view of preferred renewable energy system 20 is illustrated. As shown in FIG. 2, preferred renewable energy system 20 includes means for shutting down the renewable energy system 60. Preferred means for shutting down the renewable energy system 60 is adapted to automatically shut down the system in the event of an emergency such as a fire. Preferred means for shutting down the renewable energy system 60 comprises a plurality of heat sensors and smoke sensors (see FIG. 7). In the event heat sensors sense fire or smoke sensors sense smoke, renewable energy system 60 is adapted to automatically shut down. Preferably, means for shutting down the renewable energy system 60 comprises alarms 66 that are adapted to be activated in the event that heat sensors sense fire or smoke sensors sense smoke. The preferred means for shutting down the renewable energy system 60 further comprises black water-based paint that may be applied to the plurality of solar panels 22 and paint remover for removing the paint before the system is returned to operation. In preferred renewable energy system 20, heat and smoke sensors are located throughout the pyramid-shaped arrangement of solar panels 22.

Still referring to FIG. 2, preferred renewable energy system 20 comprises main distribution panels 70, secondary distribution panels 72, safety switches 74, automatic transfer switches 76, safety disconnect 78, combiner box 80, inverters 82, computer system 84 and fire protection panel 85. More particularly, preferred renewable energy system includes a solar panel inverter and a windmill inverter. Preferred computer system 84 controls all functions of renewable energy system 20 including all operations and logistics and is connected to key stations at all entrances and exits of the building. More particularly, preferred computer system 84 is adapted to automatically shut down renewable energy system 20 in the event of an emergency and trouble-shoot system malfunctions. Preferred fire protection panel 85 is adapted to activate the fire protection system of the building such as a sprinkler system, alarms and the like. As shown in FIG. 2, preferred renewable energy system 20 receives power from an outside source at power supply 86 and is adapted to convey electrical energy to remote locations such as different parts of the building or remote substations via risers 88. In addition to wind and solar energy, preferred renewable energy system 20 may generate electrical energy from geothermal energy and may comprise biomass power source 90 as an additional source of renewable energy. Preferably, biomass power source is adapted to utilize cellulosic biomass, however, it is contemplated within the scope of the invention that the biomass power source may utilize any suitable type of biomass. While FIG. 2 illustrates the preferred configuration and arrangement of the renewable energy system, it is contemplated within the scope of the invention that the renewable energy system may be of any suitable configuration and arrangement.

Figure 3:
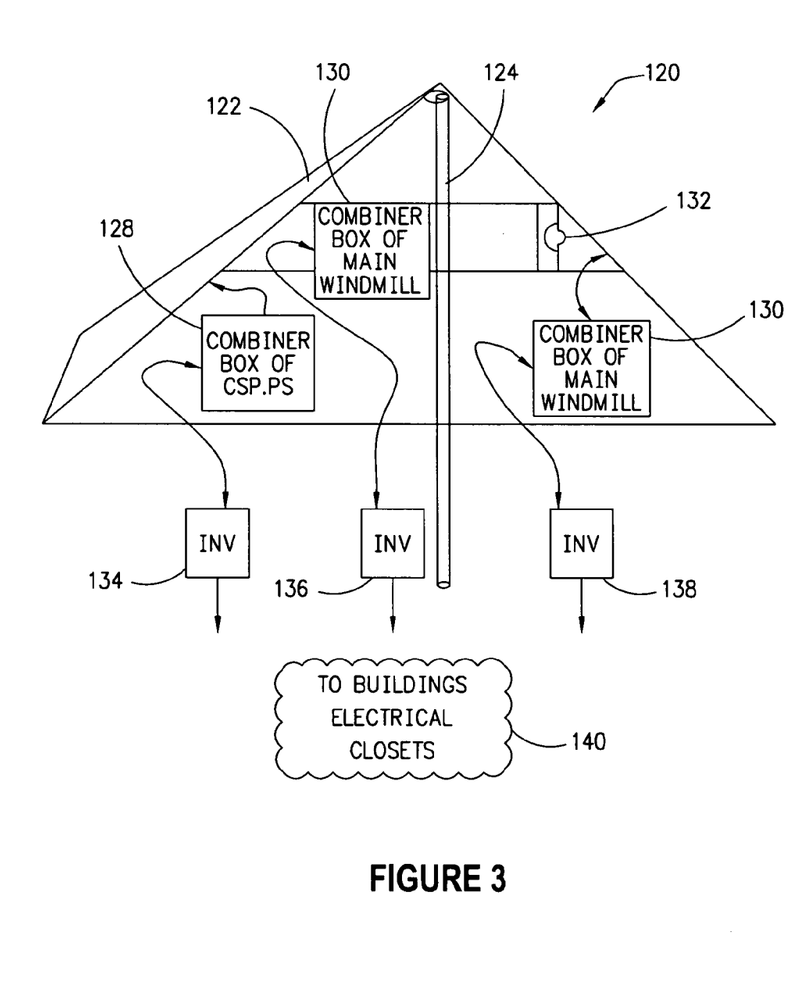
FIG. 3 is a perspective view of a first alternative embodiment of the renewable energy system in accordance with the present invention.

Referring now to FIG. 3, a perspective view of a first alternative embodiment of the renewable energy system in accordance with the present invention is illustrated. As shown in FIG. 3, the preferred renewable energy system is designated generally by reference numeral 120. Preferred renewable energy system 120 comprises a pyramid-shaped arrangement of solar panels 122, primary windmill 124 and secondary windmill 126. Preferred renewable energy system 120 further comprises a plurality of combiner boxes which are adapted to distribute DC electrical current between a plurality of smaller conductors to a single larger conductor. More particularly, preferred solar panel combiner box 128 is adapted to distribute DC current from a plurality of solar panel wires to a single larger wire. Preferred primary windmill combiner box 130 is adapted to distribute DC current from a plurality of primary windmill wires to a single larger wire. Preferred secondary windmill combiner box 132 is adapted to distribute DC current from a plurality of secondary windmill wires to a single larger wire. Preferred renewable energy system 120 further comprises a plurality of inverters. More particularly, preferred solar panel inverter 134 is adapted to convert electric current produced by solar panels 122 from DC to AC. Preferred primary windmill inverter 136 is adapted to convert electric current produced by the primary windmill from DC to AC. Preferred secondary windmill inverter 138 is adapted to convert electric current produced by the secondary windmills from DC to AC. Preferred renewable energy system 120 is also adapted to convey electrical energy to electrical closets in the building. While FIG. 3 illustrates the preferred configuration and arrangement of the renewable energy system, it is contemplated within the scope of the invention that the renewable energy system may be of any suitable configuration and arrangement.

Figure 4:
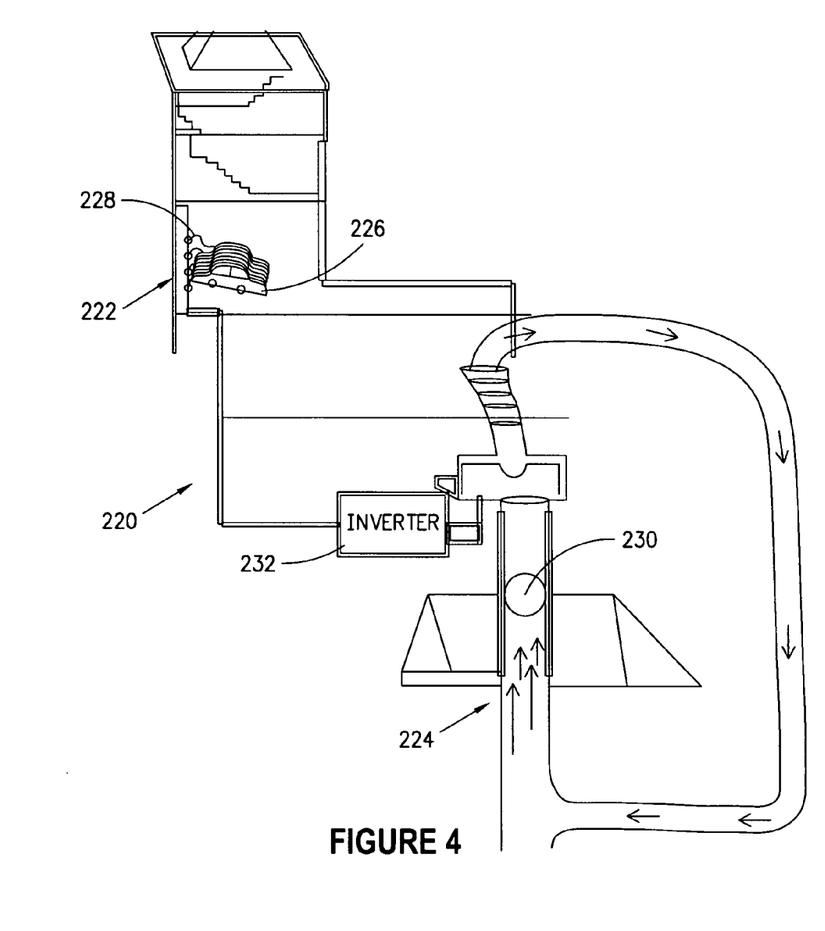
FIG. 4 is a perspective view of a second alternative embodiment of the renewable energy system in accordance with the present invention.

Referring now to FIG. 4, perspective view of a second alternative embodiment of the renewable energy system in accordance with the present invention is illustrated. As shown in FIG. 4, the preferred renewable energy system is designated generally by reference numeral 220. Preferred renewable energy system 220 comprises electric car charging system 222 and geothermal energy system 224. Preferred electric car charging system 222 is adapted to charge the batteries of electric cars 226 when the cars are parked in the parking lot of the structure in which renewable energy system 220 is used. Preferably, electrical energy is supplied to electric car charging system 222 by the other renewable energy generators in the system such as geothermal energy system 224 and electric energy is supplied to electric cars 226 by electric car charging system 222 via cables 228. While FIG. 4 illustrates the preferred configuration and arrangement electric car charging system, it is contemplated in the scope of the invention that the electric car charging system may be of any suitable configuration and arrangement.

Still referring to FIG. 4, preferred geothermal energy system 224 is adapted to produce electrical energy from geothermal energy obtained from beneath the surface of the Earth. Preferably, geothermal energy is conveyed from beneath the Earth's surface to renewable energy system 220 via geothermal turbine 230. Preferred geothermal energy system 224 may provide electrical energy to electric car charging system 222 as well as heating and air conditioning systems. Preferred geothermal energy system 224 also comprises inverter 232. While FIG. 4 illustrates the preferred configuration and arrangement of the geothermal system, it is contemplated within the scope of the invention that the geothermal energy system may be of any suitable configuration and arrangement.

Figure 5:
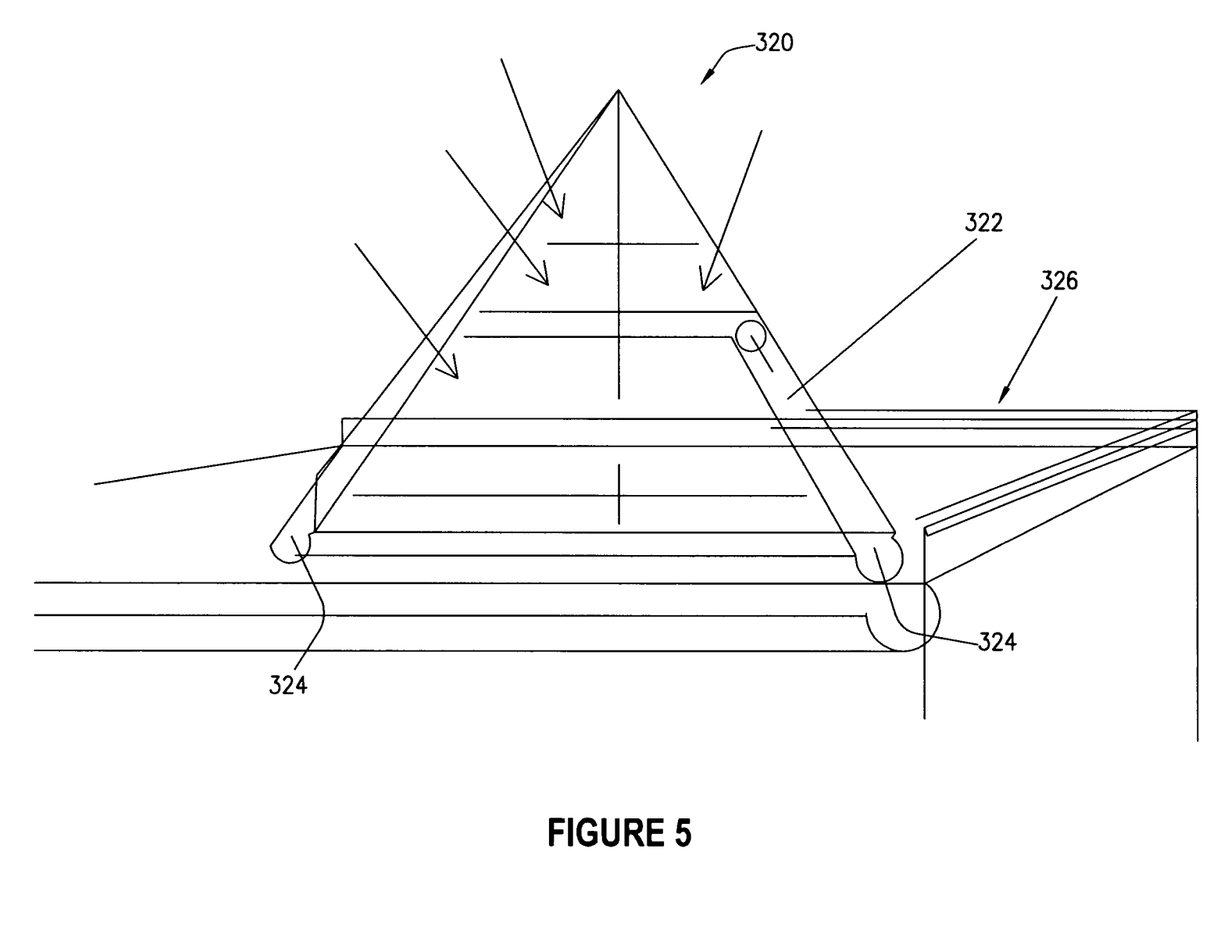
FIG. 5 is a perspective view of a third alternative embodiment of the renewable energy system in accordance with the present invention.

Referring now to FIG. 5, a perspective view of a third alternative embodiment of the renewable energy system in accordance with the present invention is illustrated. As shown in FIG. 5, the preferred renewable energy system is designated generally by reference numeral 320. Preferred renewable energy system 320 comprises rainwater collection system 322. Preferred rainwater collection system 322 is adapted to collect rainwater and other forms of precipitation and convey such precipitation to one or more collection locations or to a power generator like a turbine. Preferred rainwater collection system 322 is also adapted to convey paint and paint remover following an emergency shutdown. Preferably, rainwater collection system 322 conveys precipitation via gutters 324 and a drainage system. As also shown in FIG. 5, preferred renewable energy system 320 comprises bird protection system 326. Preferred bird protection system 326 is adapted to deter birds and other animals from the area of the renewable energy system using ultrasound. While FIG. 5 illustrates the preferred configuration and arrangement of the rainwater collection system and the bird protection system, it is contemplated within the scope of the invention that the rainwater collection system and the bird protection system may be of any suitable configuration and arrangement.

Figure 6:
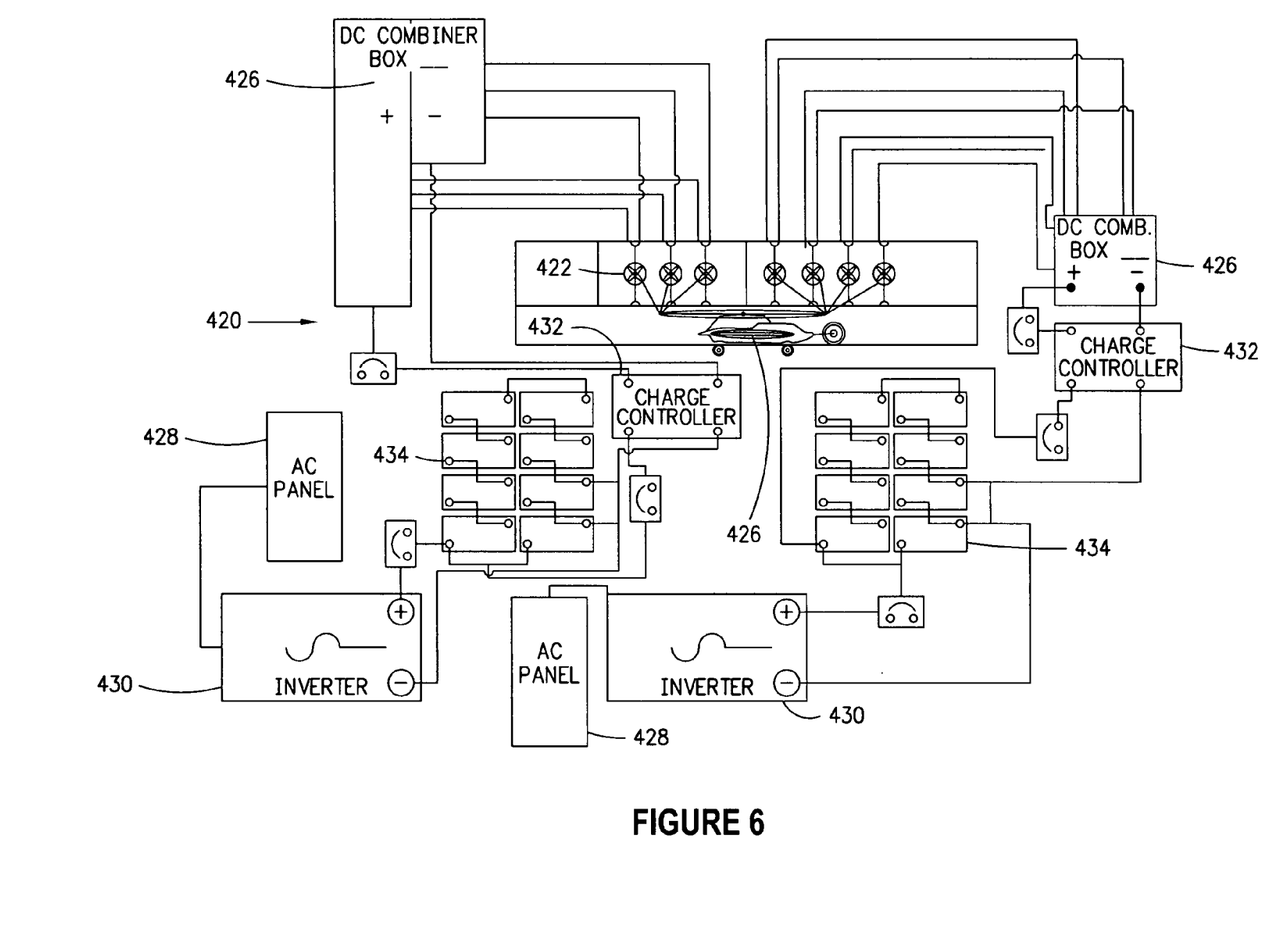
FIG. 6 is a perspective view of a fourth alternative embodiment of the renewable energy system in accordance with the present invention.

Referring now to FIG. 6, a fourth alternative embodiment of the preferred renewable energy system in accordance with the present invention is illustrated. As shown in FIG. 6, the preferred renewable energy system is designated generally by reference numeral 420. Preferred renewable energy system 420 comprises a plurality of heliport windmills 422 which are adapted to produce electrical energy from wind energy generated by helicopter 424. Preferred renewable energy system 420 also comprises combiner box 426, AC panels 428, inverters 430, charge controllers 432 and battery systems 434. While FIG. 6 illustrates the preferred configuration and arrangement of the renewable energy system, it is contemplated within the scope of the invention that the renewable energy system may be of any suitable configuration and arrangement.

Figure 7:
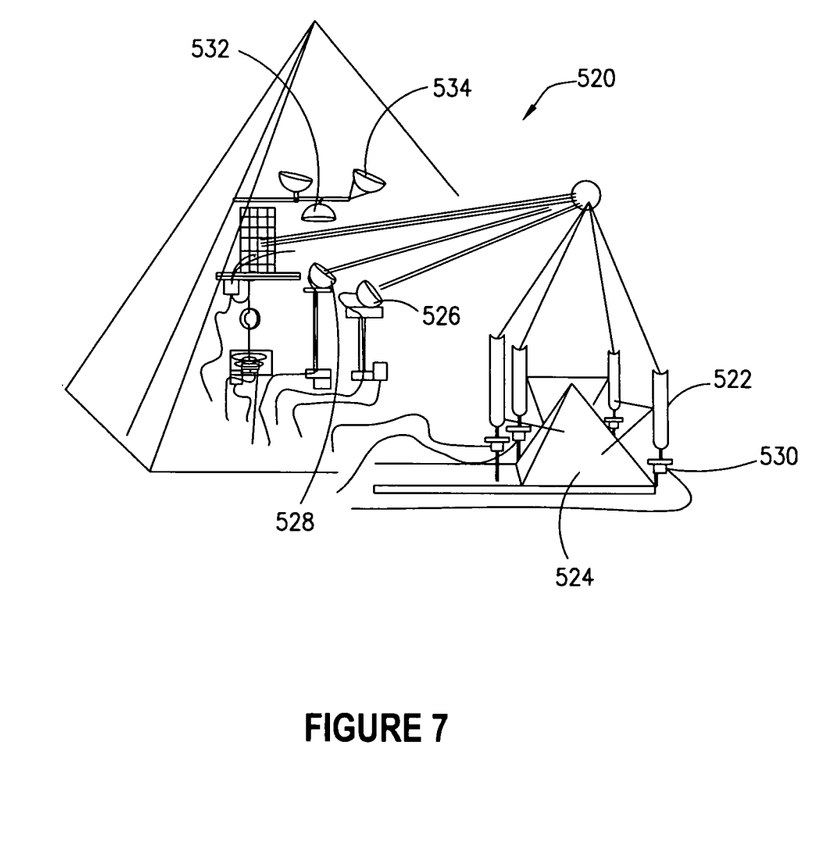
FIG. 7 is a partial sectional, perspective view of a fifth alternative embodiment of the renewable energy system in accordance with the present invention.
Figure 8:
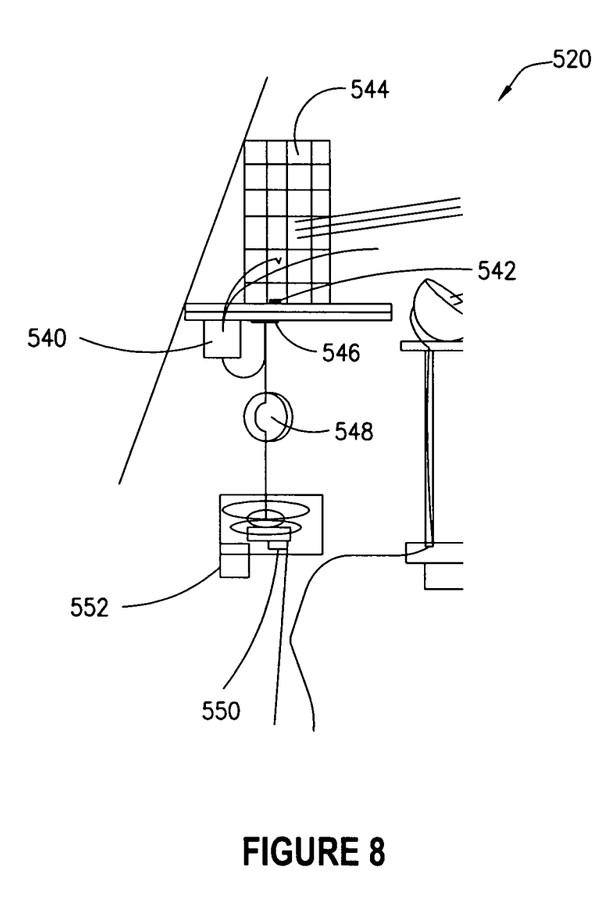
FIG. 8 is a partial sectional, perspective view of the preferred renewable energy system illustrated in FIG. 7.

Referring now to FIGS. 7 and 8, partial sectional, perspective views of a fifth alternative embodiment of the renewable energy system in accordance with the present invention are illustrated. As shown in FIG. 7, the preferred renewable energy system is designated generally by reference numeral 520. Preferred renewable energy system 520 comprises a plurality of reflective mirrors 522 which are adapted to reflect sunlight onto solar panels 524. Each preferred reflective mirror 522 is mounted at the base of each corner of the pyramid-shaped arrangement of solar panels 524. It is contemplated within the scope of the invention, however, that one or more reflective mirrors may be mounted at any suitable location relative to the plurality of solar panels. Preferably, each reflective mirror 522 is adapted to automatically be moved so as to optimize the brightness of the sunlight it reflects onto solar panels 524. Each preferred reflective mirror 522 includes sunlight sensor 526 which is adapted to sense the brightness of the sunlight the mirror reflects. Preferred sunlight sensors 526 are adapted to sense the brightest sunlight and communicate with the computer system to automatically adjust the reflective mirrors so that the mirrors follow the azimuth of the sun and maximize the solar energy reflected onto the solar panels. Preferably, each sunlight sensor 526 is also adapted to move the reflective mirrors such that their reflective surfaces are facing east upon sensing a period of prolonged darkness. Preferred mirror shutdown sensor 528 is adapted to shut down the reflective mirrors in the event of an emergency.

Still referring to FIGS. 7 and 8, each preferred reflective mirror 522 is operatively connected to a means for automatically moving the mirror in response to the brightness sensed by the corresponding sunlight sensor 526. The preferred means for automatically moving the reflective mirrors is motor 530, but it is contemplated within the scope of the invention that the means for automatically moving the reflective mirrors may be any suitable device, mechanism, assembly or combination thereof. Preferred renewable energy system 520 further comprises heat sensor 532 and smoke sensors 534 disposed near the top of the pyramid-shaped arrangement of solar panels. While FIGS. 7 and 8 illustrate the preferred configuration and arrangement of the sensors, it is contemplated within the scope of the invention that the sensors may be of any suitable configuration and arrangement. It is also contemplated within the scope of the invention that a single sunlight sensor may be provided. It is also contemplated within the scope of the invention that the sunlight sensor causes one or more solar panel to move in response to the movement of the sun.

Still referring to FIGS. 7 and 8, preferred renewable energy system 520 also comprises first combiner box 540 which is adapted to defrost solar panel heater 542 of solar panel 544 and defrost windmill heaters 546 located at the top of the windmill 548. Preferred windmill 548 comprises clutch 550 which includes windmill shutdown sensor 551 that is adapted to communicate with a computer system in order to shut down the windmills in the event of an emergency. Preferred renewable energy system 520 also comprises second combiner box 552 which is located at the bottom of windmill 548. While FIGS. 7 and 8 illustrate the preferred configuration and arrangement of the renewable energy system, it is contemplated within the scope of the invention that the renewable energy system may be of any suitable configuration and arrangement.

The invention also comprises a method for a renewable energy system. The preferred method comprises providing a renewable energy system. The preferred renewable energy system comprises a solar panel that is adapted to be mounted on a structure and convert solar energy into electrical energy, a windmill that is adapted to be mounted on the structure and convert wind energy into electrical energy, and a means for shutting down the renewable energy system that is adapted to automatically shut down the system in the event of an emergency. The preferred method further comprises converting renewable energy into electrical energy.

In operation, several advantages of the preferred embodiments of the renewable energy system are achieved. For example, the preferred embodiments of the renewable energy system are adapted to optimally utilize all of the different available sources of renewable energy to provide energy to users. The preferred embodiments of the invention are adapted to provide an apparatus and method for a renewable energy system that is less complex and less expensive to manufacture, maintain and repair. The preferred embodiments of the invention claimed herein are adapted to provide an apparatus and method for a renewable energy system that includes satisfactory safety systems. The preferred embodiments of the apparatus and method for a renewable energy system are adapted to provide an apparatus and method for a renewable energy system that is sufficiently customizable.

Although this description contains many specifics, these should not be construed as limiting the scope of the invention but as merely providing illustrations of some of the presently preferred embodiments thereof, as well as the best mode contemplated by the inventors of carrying out the invention. The invention, as described herein, is susceptible to various modifications and adaptations, and the same are intended to be comprehended within the meaning and range of equivalents of the appended claims.

What is claimed is:

1. A renewable energy system, said renewable energy system comprising:
    (a) a plurality of solar panels said plurality of solar panels being adapted to be mounted on a structure and convert solar energy into electrical energy;
    (b) a plurality of windmills, said plurality of windmills being adapted to be mounted on the structure and convert wind energy into electrical energy;
    (c) a means for shutting down the renewable energy system, said means for shutting down the renewable energy system being adapted to automatically shut down the system in the event of an emergency;
    wherein the plurality of solar panels comprise a pyramid-shaped arrangement; and
    wherein the plurality of windmills are mounted at the base of the plurality of solar panels.

2. The renewable energy system of claim 1 further comprising a reflective mirror adapted to reflect sunlight onto the plurality of solar panels.

3. The renewable energy system of claim 2 further comprising a sunlight sensor adapted to sense a sunlight brightness.

4. The renewable energy system of claim 3 wherein the reflective mirror is adapted to automatically move in response to the sunlight brightness sensed by the sunlight sensor.

5. The renewable energy system of claim 1 wherein a reflective mirror is mounted to each corner of the base of the pyramid-shaped arrangement.

6. The renewable energy system of claim 1 further comprising a primary windmill that is connected to a windmill clutch.

7. The renewable energy system of claim 1 wherein the means for shutting down the renewable energy system comprises heat sensors and smoke sensors.

8. The renewable energy system of claim 1 wherein the means for shutting down the renewable energy system comprises a windmill clutch.

9. The renewable energy system of claim 1 further comprising a heating element.

10. The renewable energy system of claim 1 further comprising a geothermal energy system.

11. The renewable energy system of claim 1 further comprising an electric car charging system.

12. The renewable energy system of claim 1 further comprising a heliport windmill.

13. The renewable energy system of claim 1 further comprising a bird protection system.

14. The renewable energy system of claim 1 further comprising a shock absorber.

15. The renewable energy system of claim 1 further comprising a battery system.

16. The renewable energy system of claim 1 further comprising a rainwater collection system.

17. The renewable energy system of claim 1 further comprising a transparent photovoltaic sheet.

18. The renewable energy system of claim 1 further comprising a combiner box.

* * * * *